United States Patent Office 3,012,952
Patented Dec. 12, 1961

3,012,952

PROCESS FOR PREPARING PHOTOPOLYMERIZABLE COMPOSITIONS

Charles Walter Smith, Red Bank, N.J., assignor to E. I. du Pont de Nemours and Company, Wilmington, Del., a corporation of Delaware
No Drawing. Filed Aug. 31, 1959, Ser. No. 836,869
13 Claims. (Cl. 204—158)

This invention relates to photopolymerizable compositions and to their preparation. More particularly, it relates to such compositions which contain a substantial amount of a cellulose ester and to their preparation. Still more particularly, it relates to a process for preparing such compositions wherein the cellulose ester is formed during the preparation of the composition.

In Plambeck U.S. Patent 2,760,863 there are disclosed various processes for making photopolymerizable compositions and elements for the preparation of relief printing plates. These compositions utilize preformed polymeric materials which are compatible with the ethylenically unsaturated compound and addition polymerization initiator. Due to the variations in the polymeric material from batch to batch the resulting photopolymerizable compositions and elements vary also.

The process of preparing photopolymerizable compositions taught by Munger in U.S. patent application Serial No. 736,661, filed May 21, 1958 (Patent No. 2,923,673, February 2, 1960), eliminates the separate preparation and isolation of the cellulose derivatives and results in uniform compositions which yield photopolymerizable layers. To obtain the uniform photopolymerizable compositions, Munger utilizes a water swelling operation prior to the esterification reaction. The water makes the preliminary mixture more homogeneous and prevents the occurrence of small white particles in the photopolymerizable layers. The water must be essentially removed, however, prior to the addition of the acid anhydride, e.g., succinic anhydride. If the water is not removed, a white deposit, bloom, which is caused by the reaction of the anhydride with the water, i.e., by the acid formed, will appear on the surface of the photopolymerizable layer. Bloom may also occur, however, if free acid, e.g., succinic acid, is present in the starting raw materials.

An object of this invention is to provide a simple and dependable process for making photopolymerizable compositions containing a cellulose mixed ester, and simultaneously forming such ester, which compositions are uniform in quality, free from white deposits and useful in making photopolymerizable layers suitable for making printing reliefs. Still other objects will be apparent from the following description.

Photopolymerizable compositions which have uniform properties, are free from bloom over extended periods of time, e.g., 3 months and longer, and can be readily cast, pressed, or extruded to form photopolymerizable layers can be prepared, in accordance with this invention, by admixing (1) finely divided particles (capable of passing through a fine mesh screen having uniform spacings or openings within the range 0.006 or less to 0.027 inch in width) of a cellulose partial ester of at least one saturated aliphatic monocarboxylic acid of 2 to 4 carbon atoms and containing free and esterifiable hydroxyl groups, (2) a dicarboxylic acid anhydride, and (3) a non-gaseous addition polymerizable ethylenically unsaturated compound. The mixture is placed on a plastics mill or in a mixer preheated to 85° C. to 180° C. and is mixed, e.g., for from 5 to 20 minutes. An esterification catalyst is added and the mixing is continued for an additional period until esterification is essentially complete, e.g., 5 to 30 minutes. In general, the ethylenically unsaturated compound is used in an amount of 10 to 60 percent by weight of the photopolymerizable composition. Suitable compounds are disclosed in Plambeck 2,760,863. Preferably the compositions also contain an addition polymerization initiator activatable by actinic light and inactive thermally at temperatures used during the esterification. The initiator can be added prior to, during and subsequent to esterification.

In a preferred manner of carrying out the invention, (1) a cellulose ester, e.g., cellulose acetate, which has been finely pulverized to pass through a screen with openings of 0.027 inch in diameter or less, (2) a compatible addition polymerizable ethylenically unsaturated compound having a boiling point at normal pressure over 100° C., a molecular weight less than 1500 and containing one to two terminal ethylenic groups, e.g., triethylene glycol diacrylate, (3) an addition polymerization initiator, preferably inactive thermally below 185° C., e.g., anthraquinone, (4) dicarboxylic acid anhydride, e.g., succinic anhydride, and, (5) a small portion of a thermal polymerization inhibitor, are mixed in a suitable mixing apparatus, e.g., a planetary mixer. The mixture is then placed on a rubber mill or in a sigma blade mixer, e.g., a Werner-Pfleiderer or a Banbury mixer, smooth or corrugated, which was preferably preheated to 100 to 140° C., and the mixture is mixed for about 5 to 20 minutes. A portion of (6) a tertiary amine esterification catalyst, e.g., diethylcyclohexylamine, is added to the mixture on the mill and is kneaded and uniformly distributed for about 5 to 30 minutes. During the milling operation, the temperature is maintained between 100 and 140° C. The photopolymerizable composition is removed from the mill, is cooled and is formed into a sheet by a pressing operation. The sheet, which is preferably between 3 and 250 mils in thickness, is then bonded to a suitable support, e.g., a steel or aluminum sheet or plate. This may be done after the manner described in Plambeck U.S. Patent 2,760,863 (see Example XVII) or in assignee's Burg application Serial No. 750,868, filed July 25, 1958, to provide a photopolymerizable element suitable for the preparation of printing reliefs by a process as described in said patent.

In an embodiment of the invention, a mixture which consists of a cellulose ester, an ethylenically unsaturated monomer, a dicarboxylic acid anhydride and preferably an addition polymerization initiator and thermal polymerization inhibitor is admixed at 85 to 180° C. for about 5 to 20 minutes. Said mixture is allowed to cool and is ground into fine particles to pass through a mesh screen, e.g., of about 20 mesh. The fine particles are then moistened with an esterification catalyst, e.g., a tertiary amine esterification catalyst, and the esterification reaction is completed without further mixing by heating the admixture at 80° C. for 4 hours. At lower temperatures, e.g., down to room temperature, the reaction is complete in longer periods of time.

It has been found that the tendency for the photopolymerizable composition to bloom can be further reduced by the addition of a small amount of a calcium salt at any stage of the process including that at which esterification occurs and that subsequent to esterification. The calcium salt, e.g., calcium acetate, can be added in amounts of 0.5 to 9 percent by weight based on the weight of the photopolymerizable composition. It is preferred, however, that the quantity added be kept in the range of about 0.5 to 2.0 percent by weight.

In general, the dicarboxylic acid anhydride will be used in an amount sufficient to introduce at least 0.2 acid ester groups per glucose unit in the cellulose chain in order to impart a satisfactory degree of solubility in the alkaline washout solution used to process the plates.

Monocarboxylic acid anhydrides can also be used. They are usually added in an amount sufficient to introduce at least 0.05 acid ester groups per glucose unit.

The use of monocarboxylic acid anhydrides can result in mixed ester compositions which have improved physical properties, e.g., tensile properties and flexibility.

The acid cellulose esters made in photopolymerizable compositions in accordance with this invention should have an acid degree of substitution of from about 0.2 to 1.25, preferably in the range of 0.60 to 0.90, i.e., that many free carboxyl groups per glucose unit. Furthermore, the neutral degree of substitution should be in the range of from about 1.5 to 2.45, preferably about 1.85. By difference, therefore, the hydroxyl groups per glucose unit should lie between 0 and about 1.3, preferably 0.25 to 0.55.

In the preferred aspect of the invention, cellulose acetate having a degree of acetyl substitution of approximately 1.85, i.e., the number of acetyl groups per glucose unit in the cellulose chain, and succinic anhydride are used to form cellulose acetate succinate.

The mixing and milling steps as well as any casting, extruding, pressing, coating, or laminating operations should be carried out at temperatures and under conditions so that no significant thermal addition polymerization takes place. Also, these steps should be carried out in the absence of sufficient actinic radiation to effect addition polymerization.

The invention will be further illustrated by, but is not intended to be limited to the following examples.

*Example I*

1200 grams of cellulose acetate (degree of acetyl substitution 1.85), which had been finely pulverized in a mechanical pulverizer so that the particles could pass through a screen with 0.010 inch openings, was placed in the 60-quart pot of a planetary mixer, the blades of which are operated by an electric motor. To the cellulose acetate was added 890 g. of polyethylene glycol diacrylate (average weight of diol precursor was 300), 0.89 g. anthraquinone, 520 g. succinic anhydride and 0.89 g. of p-methoxyphenol and the mixture was mixed for 5 minutes. The mitxure was then placed on a preheated two-roll rubber mill internally heated by steam, the rolls of which are smooth cylinders 10 inches in diameter and 20 inches in length and was admixed at 125° C. for 5 minutes. One hundred forty grams of diethylcyclohexylamine was added to the mixture on the mill and was allowed to work into the mixture by milling for 15 minutes at 140–150° C. To determine the degree of substitution of the succinyl group on the cellulose acetate, 5 g. of the photopolymerizable product prepared as described above was dissolved in 20 ml. of glacial acetic acid. The cellulose acetate succinate was precipitated by the addition of 300 ml. of water. The precipitate was washed with four 100 ml. portions of water and was dried to a constant weight in a drying oven at 105° C. Four-tenths gram of the cellulose acetate succinate thus purified was dissolved in 44 ml. of acetone and 6 ml. water and titrated with 0.1 N NaOH solution. The degree of succinyl substitution was calculated as 0.80.

The photopolymerizable sheet prepared on the mill was formed into a clear, transparent sheet, 40 mils thick, by pressing at 170° C. under a pressure of 1000 pounds per square inch. The pressed sheet was laminated to a sheet of steel, 12 mils thick by the procedure described in Example 5 of the application of Burg, Serial No. 750,868, filed July 25, 1958. The resultant element was placed in a vacuum frame, and the polymer surface was brought into contact with a line process negative. The vacuum frame containing the plate and negative was placed beneath an 1,800-watt high-pressure mercury arc, and the plate was exposed to 1.75 watts of actinic radiation per square inch for 14 seconds. After exposure, the negative was stripped from the plate, and the unexposed polymer was removed by spray washing for 10 minutes using an 0.04 N aqueous solution of NaOH. A clear, relief image firmly bonded to the base and corresponding to the clear areas of the negative was obtained. The printing plate thus prepared showed excellent image quality and long press life when used for printing on a flat press. No bloom was present or appeared on the surface of the photopolymerized layer after aging for at least 3 months.

*Example II*

A mixture consisting of 300 g. of cellulose acetate described in Example I, 208 g. of triethylene glycol diacrylate containing 0.1 percent by weight of anthraquinone and 0.1 percent by weight of p-methoxyphenol, and 127 g. of succinic anhydride was mixed at 20° C. in a 5-quart planetary mixer. The mixer was then placed on a 6-inch by 13-inch rubber mill after which it was milled at 120° C. for 5 minutes. The translucent sheet formed was removed from the rubber mill, was allowed to cool and was ground into fine particles so that it could pass through a screen of 20 mesh. Seventy grams of the finely divided particles were placed in a sealed bottle and were wet with 2.75 g. of diethylcyclohexylamine. The wet mixture was then heated to 80° C. for 4 hours to complete the esterification reaction. The degree of substitution of the succinyl group on the cellulose acetate was determined as described in Example I and was calculated as 0.77. The dry granules were formed into a clear, transparent sheet, and a photopolymerizable plate was made as in Example I, similar results being obtained. No white specks were present in the layer and no bloom formed upon aging for at least 3 months.

*Example III*

A photopolymerizable composition was prepared as described in Example I. To 100 g. of the composition was added 3.0 g of succinic acid to accelerate the formation of bloom. To a 50 g. portion of the photopolymerizable composition containing the succinic acid was added 2 g. of calcium acetate to neutralize the added succinic acid. Two photopolymerizable sheets were formed by pressing and laminating to steel supports as described in Example I. Bloom occurred on the surface of the element not containing the calcium acetate in less than 16 hours. The element to which the calcium acetate had been added was free from bloom after being aged for at least 4 months.

*Example IV*

Two hundred eighty grams of cellulose acetate as described in Example I, 210 g. of triethylene glycol diacrylate, 185 g. of phthalic anhydride, 0.21 g. of anthraquinone and 0.21 g. of p-methoxyphenol were mixed in a planetary mixer for 5 minutes. The mixture was then placed on a preheated rubber mill as described in Example II and milled at 125° C. for 5 minutes. Forty-two and six tenths grams of diethylcyclohexylamine mixed with 20 g. of the cellulose acetate described above was added to the mixture on the mill, and the milling was continued for 15 minutes. The degree of succinyl substitution determined by the procedure described in Example I was calculated as 0.75. A photopolymerizable sheet was prepared and laminated to a steel sheet support as described in Example I. The element was exposed by means of the light source described in Example I to 1.75 watts of actinic radiation per square inch for 16 seconds. The unexposed areas of the element were then removed by spray washing for 11 minutes using an 0.04 N aqueous solution of NaOH. A printing plate of quality comparable to that obtained in Example I was formed. No bloom was present on the polymer surface after aging for 3 months.

*Example V*

Example IV was repeated except that the preliminary mixture consisted of 280 g. of the finely pulverized cellulose acetate described in Example I, 208 g. of triethylene glycol diacrylate, 127 g. of succinic anhydride, 0.2 g. of anthraquinone and 0.2 g. of p-methoxyphenol. After milling at 125° C. for 5 minutes, 51 g. of tributylamine and 20 g. of cellulose acetate described above was added to the mixture on the mill and the milling was continued for 15 minutes. The composition had a degree of succinyl substitution of 0.78 determined by the procedure described in Example I. The photopolymerizable composition was formed into a sheet, was laminated to a 15-mil thick sheet of aluminum, was exposed, and was washed out as described in Example I. A printing plate of comparable quality was obtained. No bloom was present on the polymer surface after aging for 3 months. A second printing plate was prepared as described above in this example except that 62 g. of triamylamine was used in place of the tributylamine. The photopolymerizable composition had a succinyl degree of substitution of 0.84. Similar results were obtained as described in Example I with no bloom appearing on the polymer surface after aging for 3 months.

*Example VI*

Six hundred grams of cellulose acetate as described in Example I, 462 g. of propionic anhydride, 250 g. of triethylene glycol diacrylate containing 0.1% by weight of anthraquinone and 0.1% by weight of p-methoxyphenol were mixed in the planetary mixer described in Example I for 5 minutes. The mixture was then placed on a preheated rubber mill as described in Example I and milled at 120° C. for 15 minutes. Nine and one tenth grams of diethylcyclohexylamine was then added to the mixture on the mill and the milling was continued for 15 minutes. The degree of apparent acetyl was determined for both the cellulose acetate and the cellulose acetate propionate, the final product by the method described in ASTM D817–55T Method A. The difference in apparent percent combined acetic acid was 4.2. This apparent increase was recalculated as a degree of propionyl substitution of 0.33. A printing element was prepared as described in Example I except that after exposure and removal of the negative the unexposed polymer was removed by washing with acetone. A relief image firmly bonded to the steel and corresponding to the clear areas of the negative was obtained. No bloom was present on the surface of the printing plate after aging for 3 months.

*Example VII*

A mixture of 260 g. of cellulose acetate finely pulverized as described in Example I, 180 g. of triethylene glycol diacrylate, 0.72 g. of p-methoxyphenol, 0.18 g. of mucochloric acid and 110 g. of succinic anhydride was mixed for 5 minutes in the planetary mixer described in Example II. The mixture was placed on the preheated (130° C.) rubber mill described in Example II and milled for 5 minutes. Forty three and five tenths grams of diethylcyclohexylamine was added to the mixture on the mill and the milling was continued for 12 minutes at 135° C. While the mixture was still milling, the mill rolls were cooled to achieve a stock temperature of 100° C. in a period of 13 minutes. Thirty six hundredths gram of benzoin (0.2 percent by weight based on the weight of the ethylenically unsaturated compound) was added to the photopolymerizable composition and the composition was milled for 5 minutes at 100° C. The composition was removed from the mill, granulated and pressed for 1 minute at less than 100° C. into a sheet 50 mils in thickness. The photopolymerizable sheet was then laminated for 2 minutes in a press, the platens of which were heated to 150° C., to a 12-mil thick steel sheet support as described in Example 5 of Assignee's Burg application Serial No. 750,868 filed July 25, 1958. The resulting element was then placed in a vacuum frame, the polymer surface in contact with a line process negative and exposed to 1.75 watts of actinic radiation per square inch for 24 seconds. The unexposed areas were removed by washing with 0.4 N NaOH as described in Example I. A clear, relief image firmly bonded to the base and corresponding to the clear areas of the negative was obtained. The initiators in active thermally below 85° C. disclosed in U.S. Patents 2,716,633, 2,722,512 and 2,760,863 can be used in the present processes.

Preferred addition polymerization initiators activatable by actinic light and inactive thermally below 185° C. include those of the anthraquinone type disclosed in Notley application Ser. No. 659,772 filed May 17, 1957, now U.S. Patent No. 2,951,758. Suitable such initiators which can be used in procedures like those of the examples include 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz[a]anthracene-7,12-dione.

Cellulose acetate with a degree of acetyl substitution of 1.85 is one of the preferred reactants; the degree of acetyl substitution, however, may vary above or below that amount. In addition, other cellulose esters may be used, e.g., cellulose esters having free and esterfiiable hydroxyl groups such as cellulose acetate propionate, cellulose acetate butyrate, cellulose propionate and cellulose butyrate. The cellulose esters are finely pulverized, e.g., by means of a disintegrator, by grinding, precipitation, etc., so that they can pass through an opening of up to 0.027 inch in diameter.

The anhydrides of mono- and dicarboxylic acids may be used. Anhydrides of the monocarboxylic acids which give a satisfactory product may range from 2 to 18 carbons in lengths, 2–4 carbons being preferred. When the photopolymerizable material is prepared using monocarboxylic acid anhydrides, the unexposed portion of an element using such photopolymerizable material is removed by use of an organic solvent, i.e., acetone, the preferred solvent, or dioxane, ethylene glycol monoethyl ether or methyl ethyl ketone. The solvent may be applied in any conventional manner, as by pouring, immersion, spraying or brushing in removing unpolymerized portions of the composition. The dicarboxylic acid anhydrides which may be used in accordance with the invention include succinic and glutaric anhydride, i.e., those having 4 or 5 carbon atoms, succinic anhydride being the preferred compound. Maleic anhydride can also be used. It is also possible to use anhydrides of aromatic dicarboxylic acids, e.g., phthalic anhydride, and heterocyclic dicarboxylic anhydrides, e.g., tetrahydrophthalic, hexahydrophthalic, and endo -cis-bicyclo [2.2.1]-5-heptene-2, 3-dicarboxylic anhydride. The unexposed portion of a photopolymerized element prepared using dicarboxylic acid anhydrides is readily removed, e.g., by impingement of spray jets or other washing procedures using a .02 to 0.5 N aqueous solution of sodium hydroxide or other weak base at room temperature.

Suitable ethylenically unsaturated compounds in addition to the preferred triethylene glycol diacrylate include ethylene glycol diacrylate, diethylene glycol diacrylate, tetramethylene glycol diacrylate, diallyl itaconate, polyethylene glycol diacrylate with the average molecular weight of the glycol ranging from 200 to 600, ethylene glycol dimethacrylate, diethylene glycol dimethacrylate, triethylene glycol dimethacrylate, and tetramethylene glycol dimethacrylate, etc. Saturated plasticizers may also be present in the compositions along with the ethylenically unsaturated compounds, e.g., glyceryltriacetate (triacetin), glyceryltributyrate, triethylene glycol dipropionate, triphenyl phosphate and dimethyl phthalate.

Esterification catalysts can be added in amounts up to 20 percent by weight based on the weight of the reactants. Tertiary organic amines are especially useful and diethylcyclohexylamine is the preferred compound. Pyridine, triethylamine, tributylamine, triamylamine, trimethylamine acetate and pyridine acetate are also useful. In addition, several inorganic esterification catalysts may be used. These include: sodium carbonate, sodium phosphate, sodium borate, sodium acetate, lithium acetate, calcium acetate, potassium acetate, magnesium acetate and potassium carbonate. It is possible to get an esterification reaction without the use of a catalyst but the rate of reaction is considerably slower.

In the preferred photopolymerizable compositions, a thermal polymerization inhibitor, 0.001 to 2 percent by weight based on the weight of the ethylenically unsaturated compound, is present. Examples of inhibitors include preferably p-methoxyphenol, and in addition, hydroquinone, alkyl and aryl-substituted hydroquinones, tert-butyl catechol, pyrogallol, naphthylamines, β-naphthol, p-benzoquinone, 2,6-di-tert-butyl-p-cresol, dicyclopentadienyliron, phenothiazine, pyridine, nitrobenzene and dinitrobenzene. Other useful inhibitors include p-toluquinone, chloranil, and thiazine dyes, e.g., thionine, thionine blue G, methylene blue B and toluidine blue O.

Calcium salts which can be added to reduce the tendency of the photopolymerizable compositions to bloom include preferably calcium acetate and in addition calcium chloride, calcium nitrate, etc. The calcium salt may be present in amounts from 0.5 to 9.0 percent by weight based on the weight of the photopolymerizable composition and can be added at any stage of the process including that subsequent to esterification. Preferably the amount added should be kept as low as possible, e.g., 0.5 to 2 percent by weight, because if too much calcium salt is present haze develops in the photopolymerizable layers.

It is preferred that after the preliminary mixing the mixture be placed on a preheated rubber mill (i.e., such a mill heated to 85° C. to 180° C.). The mixture may be milled at these temperatures generally from 5 to 60 minutes. It should be pointed out that at 180° C. if the product is milled for longer than 5 minutes it becomes charred and black. As the temperature is decreased, however, the time of mixing may be increased. At 120° C. or possibly at a slightly higher temperature the mixture may be milled without any charring for at least 60 minutes. While the rubber mill is the preferred apparatus to heat and mix the product, other kneading devices and plastics extruders may also be used. Suitable mixers or mills include sigma blade mixers, e.g., Werner-Pfleiderer and Banbury mixers-mills of all types including smooth and corrugated type.

This invention is useful for the preparation of photosensitive, addition polymerizable polymeric compositions, said compositions being particularly useful in the preparation of photopolymerizable printing elements, e.g., printing reliefs.

The printing reliefs made in accordance with this invention can be used in all classes of printing but are most applicable to those classes of printing wherein a distinct difference of height between printing and non-printing areas is required. These classes include those wherein the ink is carried by the raised portion of the relief such as in dry-offset printing, ordinary letterpress printing, the latter requiring greater height differences between printing and non-printing areas, and those wherein the ink is carried by the recessed portions of the relief such as intaglio printing, e.g., line and inverted halftone. The plates are useful for multicolor printing.

The photopolymerizable compositions prepared by the instant invention are useful in the preparation of photoresists for etching, gravure, etc.; planographic plates; matrices for printing mattes; and screens for "silk screen" printing or as stencils. The compositions can be coated onto printing cylinders, e.g., plastic or metal cylinders.

The photopolymerizable compositions are also suitable for other purposes, in addition to the printing uses described above, in which readily insolubilized, solid, addition polymerizable compositions are useful, e.g., as ornamental plaques or for producing ornamental effects; as patterns for automatic engraving machines, foundry molds, cutting and stamping dyes, name stamps, relief maps; for braille; as rapid cure coatings, e.g., on film base, inside tanks; as variable area and variable density sound tracks on film; for embossing plastics; in the preparation of printed circuits; for affixing phosphors to surfaces to provide color television screens; and in the preparation of other plastic articles.

This invention has an economic advantage over prior art procedures of making photopolymerizable compositions. By this invention, such a product is prepared in a two-step operation compared to the numerous steps where the celulose ester is made separately and then admixed with the ingredients of a photopolymerizable composition. This process results in the saving of equipment, materials, and operating costs. The product is rapidly made (in less than one hour), no temporary solvent is used (i.e., no solvent must be removed before the product is suitable for use), and the recovery of solvents, etc., are essentially eliminated. Moreover, the final product does not have to be treated before it is recovered. In addition, the photopolymerizable compositions formed have essentially uniform properties, i.e., they are free from homogeneous defects such as white specks, and the development of a white deposit, bloom, upon the surface of the layer is delayed for at least 3 months and more. The improved quality is obtained without the use of a preliminary water-swelling step in a shorter period of time than is known in the art.

What is claimed is:

1. A process for making an addition polymerizable composition containing a cellulose mixed ester and simultaneously forming said ester which comprises admixing (1) finely divided particles capable of passing through a screen having uniform openings not greater than 0.027 inch in their largest dimension of a cellulose partial ester of at least one saturated aliphatic monocarboxylic acid of 2 to 4 carbon atoms, (2) a dicarboxylic acid anhydride and (3) a non-gaseous addition-polymerizable ethylenically unsaturated compound, heating the constituents while mixing at a temperature from 85° C. to 185° C., admixing an esterification catalyst and maintaining all of said constituents at said temperature until esterification is essentially complete.

2. A process as defined in claim 1 wherein each of said heating steps is carried out for a period of about 5 to about 30 minutes.

3. A process as defined in claim 1 wherein said partial ester is cellulose acetate.

4. A process as defined in claim 1 wherein said anhydride is succinic anhydride.

5. A process as defined in claim 1 wherein said partial ester is celulose acetate and said anhydride is succinic anhydride.

6. A process as defined in claim 1 wherein said particles are capable of passing through a screen having openings in the range 0.006 to 0.027 inch.

7. A process as defined in claim 1 wherein a tertiary amine esterification catalyst is used.

8. A process as defined in claim 1 wherein an addition polymerization initiator activatable by actinic light and inactive thermally below 85° C. is present at some stage of the process subsequent to completion of the esterification reaction.

9. A process as defined in claim 1 wherein an addition polymerization initiator activatable by actinic light and inactive thermally below 185° C. is present at some stage of the process including prior and subsequent to completion of the esterification reaction.

10. A process as defined in claim 1 wherein said unsaturated compound is an acrylic acid diester of a glycol taken from the group consisting of ethylene glycol and polyethylene glycols having an average molecular weight less than 600.

11. A process as defined in claim 1 wherein a small amount of a calcium salt is present at any stage of the process including that at which esterification occurs and subsequent to esterification.

12. A process as defined in claim 1 wherein 0.5% to 9.0% of calcium acetate is present at any stage of the process including that at which esterification occurs and subsequent to esterification.

13. A process for making an addition polymerizable composition containing a cellulose mixed ester and simultaneously forming said ester which comprises admixing (1) finely divided particles capable of passing through a screen having uniform openings not greater than 0.027 inch in their largest dimension of a cellulose partial ester of at least one saturated aliphatic monocarboxylic acid of 2 to 4 carbon atoms, (2) a dicarboxylic acid anhydride and (3) a non-gaseous addition-polymerizable ethylenically unsaturated compound, heating the admixture to 85° C. to 180° C. for about 5 to 20 minutes, allowing the mixture to cool, grinding the mixture into fine particles, adding an esterification catalyst and heating the admixture at a temperature between room temperature and 80° C. until the esterification reaction is complete.

No references cited.